United States Patent [19]

González et al.

[11] Patent Number: 5,245,569
[45] Date of Patent: Sep. 14, 1993

[54] SEMICONDUCTOR MEMORY DEVICE WITH CIRCUIT FOR ISOLATING ARRAYED MEMORY CELLS, AND METHOD FOR ISOLATING

[75] Inventors: Fernando González; Roger Lee, both of Boise, Id.

[73] Assignee: Micron Technology, Inc., Boise, Id.

[21] Appl. No.: 843,857

[22] Filed: Feb. 27, 1992

[51] Int. Cl.$^5$ .................... G11C 7/02; G11C 16/02
[52] U.S. Cl. .................... 365/182; 365/185; 365/104; 365/206; 365/189.04
[58] Field of Search ............... 365/182, 185, 104, 206, 365/189.04

[56] References Cited

U.S. PATENT DOCUMENTS

| | | | |
|---|---|---|---|
| 4,458,348 | 7/1984 | Fukuda et al. | 365/104 |
| 4,888,734 | 12/1989 | Lee et al. | 365/104 |
| 5,027,321 | 6/1991 | Park | 365/185 |

*Primary Examiner*—Eugene R. LaRoche
*Assistant Examiner*—Huan Hoang
*Attorney, Agent, or Firm*—Wells, St. John, Roberts, Gregory & Matkin

[57] ABSTRACT

A semiconductor memory device has an array of memory cells which are accessed by digit and word lines. The device includes a digit line controller for selecting a digit line to access a preselected memory cell and for applying an activation voltage to the selected digit line. The device also has an isolation voltage generator for generating an isolation voltage. An isolating circuit then transfers the isolation voltage to digit lines immediately adjacent to the selected digit line to isolate neighboring memory cells from the memory cell being accessed. This isolation voltage effectively reduces or eliminates parasitic leakage between neighboring memory cells in high voltage and highly integrated memories.

11 Claims, 4 Drawing Sheets

SEMICONDUCTOR MEMORY DEVICE WITH CIRCUIT FOR ISOLATING ARRAYED MEMORY CELLS, AND METHOD FOR ISOLATING

TECHNICAL FIELD

The present invention relates to semiconductor memory devices and, more particularly, to a circuit for isolating arrayed memory cells which are not being accessed.

BACKGROUND OF THE INVENTION

A problem which plagues semiconductor memory devices is that of parasitic leakage. In NMOS devices, for example, parasitic leakage occurs between N-doped regions of neighboring memory cells. Parasitic leakage in such devices is caused by the formation of an undesired channel beneath the insulating field oxide separating the neighboring memory cells. More specifically, parasitic leakage occurs at and along the edges of row or word lines arranged on top of the field oxide. Electrons from the N-doped regions of a memory cell migrate beneath the field oxide at and along the edges of a word lines to a neighboring memory cell when a sufficiently high voltage is applied to that word line.

Typically, the parasitic leakage problem has been obviated through the use of a thick and long field channel insulating field oxide. Unfortunately, this technique is not conducive to a goal of scaling down memory device size to increase memory density. As processing technology improves, memory devices are being scaled down below 0.5 micron. As these devices are scaled down to such sizes, thick and long field channel insulating field oxides can no longer be formed.

Accordingly, as processes improve, the problem of parasitic leakage returns.

Parasitic leakage is not as severe a problem in memory devices having low word line and digit line voltages, such as 5 volts. However, as the digit line and word line voltages are increased to levels such as 10–15 volts or more, the problem becomes more severe. For this reason, the problem of parasitic leakage is particularly relevant for electrically programmable read only memories (EPROMs) and electrically erasable programmable read only memories (EEPROMs). EPROM and EEPROM cells can be programmed after manufacture by applying high voltages to selected memory cells to electrically bias the memory cells and create binary "1"s and "0"s. The high voltages are applied to digit lines and word lines used to access the selected memory cell. Parasitic leakage occurs during the programming of the individual EPROM and EEPROM cells as a result of the high voltages being applied to the digit and word lines. Such leakage is detrimental to the programmability of the memory.

The present invention provides a semiconductor memory device which reduces parasitic leakage between neighboring memory cells.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
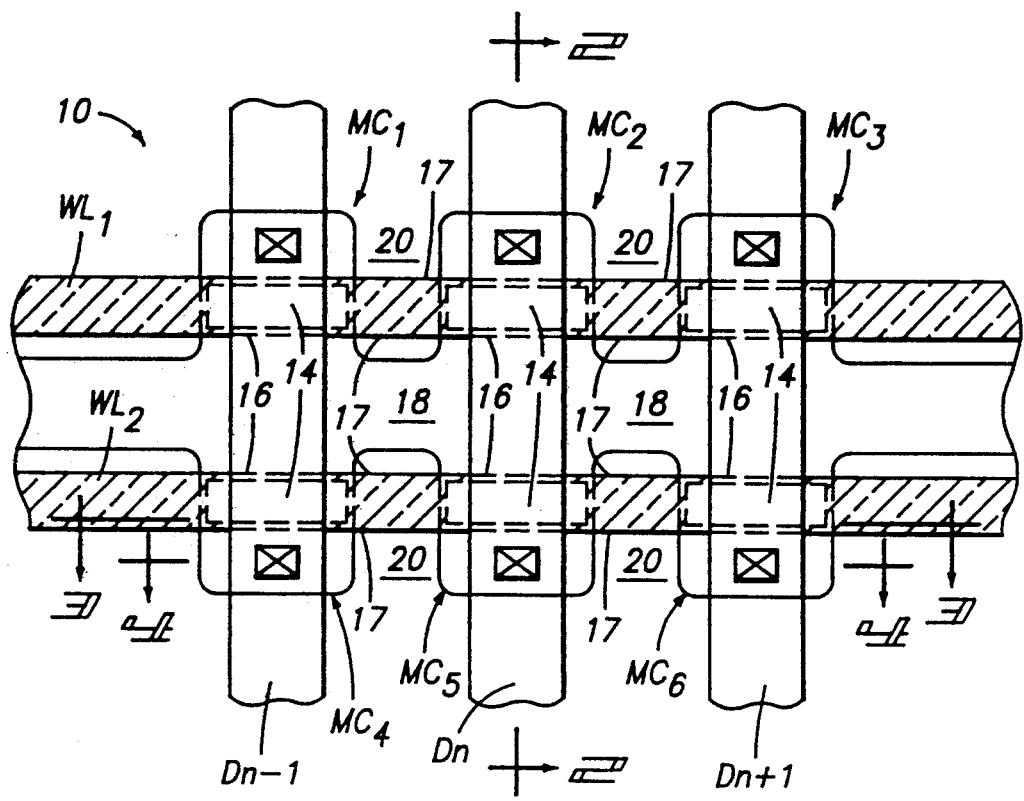
FIG. 1 is a top plan view of a segment of a semiconductor EPROM device having arrayed memory cells with floating gate construction.

This disclosure of the invention is submitted in furtherance of the constitutional purposes of the U.S. Patent Laws "to promote the progress of science and useful arts" (Article 1, Section 8).

In accordance with one aspect of the present invention, a semiconductor memory device comprises:
  an array of memory cells, individual memory cells having an active area;
  a plurality of conductive digit lines for accessing the memory cells, the digit lines electrically engaging the active areas of the memory cells;
  control means for selecting a digit line to access a memory cell and for applying an activation voltage to the selected digit line; and
  isolating means for supplying an isolation voltage to digit lines immediately adjacent to the selected digit line for isolating neighboring memory cells from parasitic leakage from the memory cell being accessed, the isolation voltage being less than the activation voltage.

Preferably, the isolating means also identifies the immediately adjacent digit lines in response to the activation voltage applied to the selected digit line.

In accordance with another aspect of the present invention, the isolating means comprises voltage generating means for providing the isolation voltage and transfer means, coupled between the voltage generating means and the digit lines, for passing the isolation voltage to the digit lines immediately adjacent to the selected digit line.

In accordance with yet another aspect of the present invention, the transfer means comprises a plurality of cells, whereby individual cells comprise a first transistor having a source coupled to the voltage generating means, a drain coupled to one of the adjacent digit lines, and a gate coupled to the selected digit line. The individual cells also comprise a second transistor having a source coupled to the voltage generating means, a drain coupled to the selected digit line, and a gate coupled to the one adjacent digit line.

In accordance with a further aspect, the present invention comprises an electrically programmable read only memory comprising:
  an array of programmable memory cells, individual memory cells having an active area and a gate;
  a plurality of conductive word lines for accessing the memory cells, the word lines electrically engaging the gates of the memory cells;
  a plurality of conductive digit lines for accessing the memory cells, the digit lines electrically engaging the active areas of the memory cells;
  control means for selecting a memory cell to be programmed and for applying a program voltage sufficient to program the memory cell to a digit line that accesses the selected memory cell; and isolating means for supplying an isolation voltage to digit lines immediately adjacent to the digit line that accesses the selected memory cell to isolate neighboring memory cells from parasitic leakage from the selected memory cell, the isolation voltage being less than the program voltage.

In accordance with still a further aspect, the present invention comprises a method for isolating a selected memory cell from neighboring memory cells in a semiconductor memory device having a plurality of memory cells and a plurality of conductive digit lines for accessing the memory cells, individual memory cells having an active area, the digit lines electrically engaging the active areas of the memory cells, the method comprising the steps of:

applying an activation voltage to a selected digit line to access a selected memory cell;

generating an isolation voltage which is less than the activation voltage; and applying the isolation voltage to digit lines immediately adjacent to the digit line that accesses the selected memory cell for isolating neighboring memory cells from parasitic leakage from the selected memory cell, the isolation voltage being applied simultaneously with the application of the activation voltage.

Figure 2:
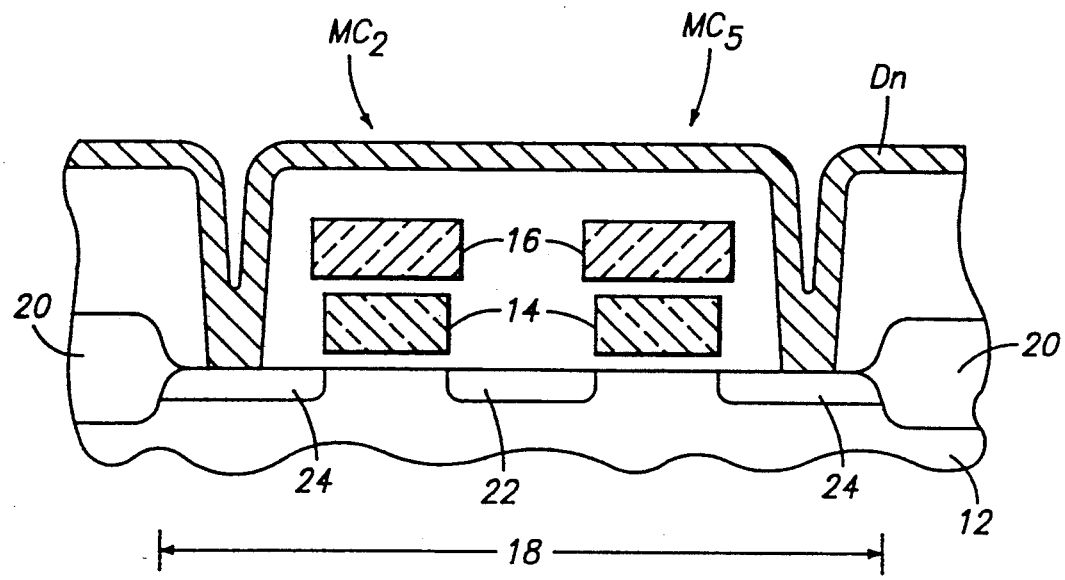
FIG. 2 is a cross-sectional view taken through lines 2—2 in FIG. 1.
Figure 3:
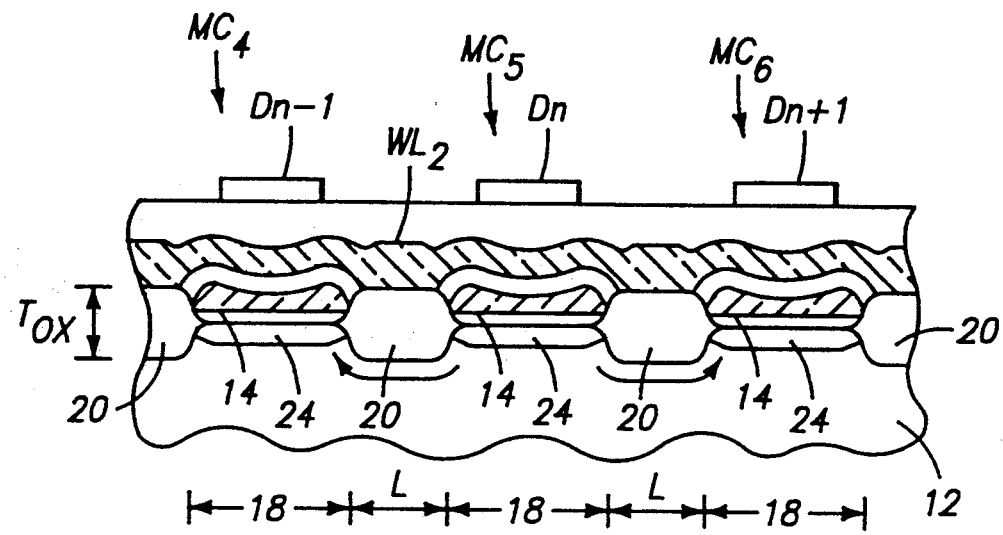
FIG. 3 is a cross-sectional view taken through lines 3—3 in FIG. 1.
Figure 4:
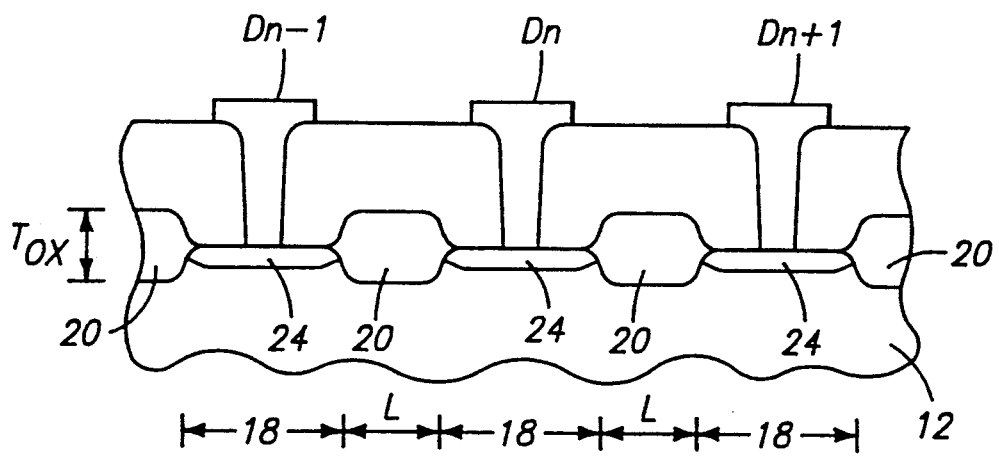
FIG. 4 is a cross-sectional view taken through lines 4—4 in FIG. 1.

FIG. 1 shows a segment of a semiconductor memory device 10 having arrayed memory. FIGS. 2-4 show cross-sectional segments of semiconductor memory device 10. The present invention is primarily directed to non-volatile memories. For purposes of describing the invention, semiconductor device 10 is an EPROM having a floating gate memory cell construction. The invention is not, however, limited to this floating gate construction or to EPROMs. The present invention is applicable to other EPROM constructions, such as an anti-fuse type EPROM. Additionally, the present invention is applicable to other semiconductor memory devices, such as any digit and word line arrayed memory which operates using high activation voltages that are greater than five volts.

With reference to FIGS. 1-4, semiconductor memory device or EPROM 10 has an array of memory cells $MC_1$-$MC_6$ formed on a semiconductor substrate 12. Memory cells $MC_1$-$MC_6$ are formed in an active region 18 and are insulated from one another by a field oxide 20. For example, field oxide 20 separates neighboring memory cells $MC_1$ and $MC_2$ and neighboring memory cells $MC_5$ and $MC_6$. Field oxide 20 has a length L and a thickness $T_{ox}$ (FIGS. 3 and 4).

Individual memory cells have a source 22 and a drain 24 formed in substrate 12 within active area 18 (FIG. 2). Adjacent memory cells (such as $MC_2$ and $MC_5$) share a common source 22. Source 22 and drain 24 are doped with impurities of a conductivity type different than that of substrate 12. For example, if substrate 12 is p-type, source 22 and drain 24 would be doped with an n-type impurity.

Individual memory cells also include a floating gate 14 and a control gate 16. Floating gate 14 is formed of a first polysilicon layer and is suspended above and insulated from substrate 12. Control gate 16 is formed of a second polysilicon layer and is provided above and insulated from floating gate 14.

EPROM 10 includes conductive digit lines $D_{n-1}$, $D_n$, and $D_{n+1}$ and conductive word lines $WL_1$, $WL_2$ arranged to access individual memory cells $MC_1$-$MC_6$. Word lines $WL_1$ and $WL_2$ are formed of the second polysilicon layer and thereby define control gates 16. For example, word line $WL_1$ defines control gates 16 for memory cells $MC_1$-$MC_3$. Digit lines $D_{n-1}$, $D_n$, and $D_{n+1}$ are formed of metal and electrically engage active regions 18, or more particularly, drains 24 of memory cells $MC_1$-$MC_6$ (FIGS. 2 and 4).

To program a memory cell in EPROM 10, a program voltage is applied to the word and digit lines of the selected memory cell. The program voltage is sufficient to generate hot electrons and a vertical electric field to attract the hot electrons onto the floating gate of the memory cell. For explanation purposes, assume that it is desired to program memory cell $MC_5$. A high voltage such as 14 volts is applied to word line $WL_2$ and a high voltage such as 10 volts is applied to digit line $D_n$. These high programming voltages place a charge on floating gate 14 of selected memory cell $MC_5$ which remains after the programming voltages are removed to thereby program memory cell $MC_5$ to a binary "1".

During this programming, however, EPROM 10 (absent the present invention) can experience parasitic leakage. FIG. 3 illustrates the parasitic leakage problem associated with programming EPROM 10. When the high voltage is applied to word line $WL_2$, undesired "channels" can form beneath field oxide 20 under the edges of word line $WL_2$ between memory cell $MC_5$ and neighboring memory cells $MC_4$ and $MC_6$. These "channels" cause undesired parasitic leakage as illustrated by the arrows immediately beneath field oxide 20. The "channels" form at and along the edges of word line $WL_2$ (which are referenced with numeral 17 in FIG. 1) since the N-doped regions in active area 18 are situated beneath the edges. No "channels" form beneath field oxide 20 under the middle of word line $WL_2$ because there is no N-doped region in active area 18 under the middle of word line $WL_2$.

As memory cells are sealed down in an effort to increase memory density, length L and thickness $T_{ox}$ of field oxide 20 are decreased. The smaller field oxide allows for easier formation of undesired "channels" beneath the field oxide under the edges of the word line. As a result, the problems associated with parasitic leakage become more significant.

The inventors have discovered that placing a voltage on the immediately adjacent digit lines $D_{n-1}$ and $D_{n+1}$ will help reduce or eliminate parasitic leakage between neighboring drain regions. This voltage, which will be referred to as an "isolation voltage $V_i$", is lower than the high voltage applied to selected digit line $D_n$ and is preferably one volt. Adding an isolation voltage $V_i$ to the adjacent digit lines $D_{n-1}$ and $D_{n+1}$ effectively lowers substrate biasing voltage which helps prevent parasitic leakage beneath field oxide 20.

Figure 5:
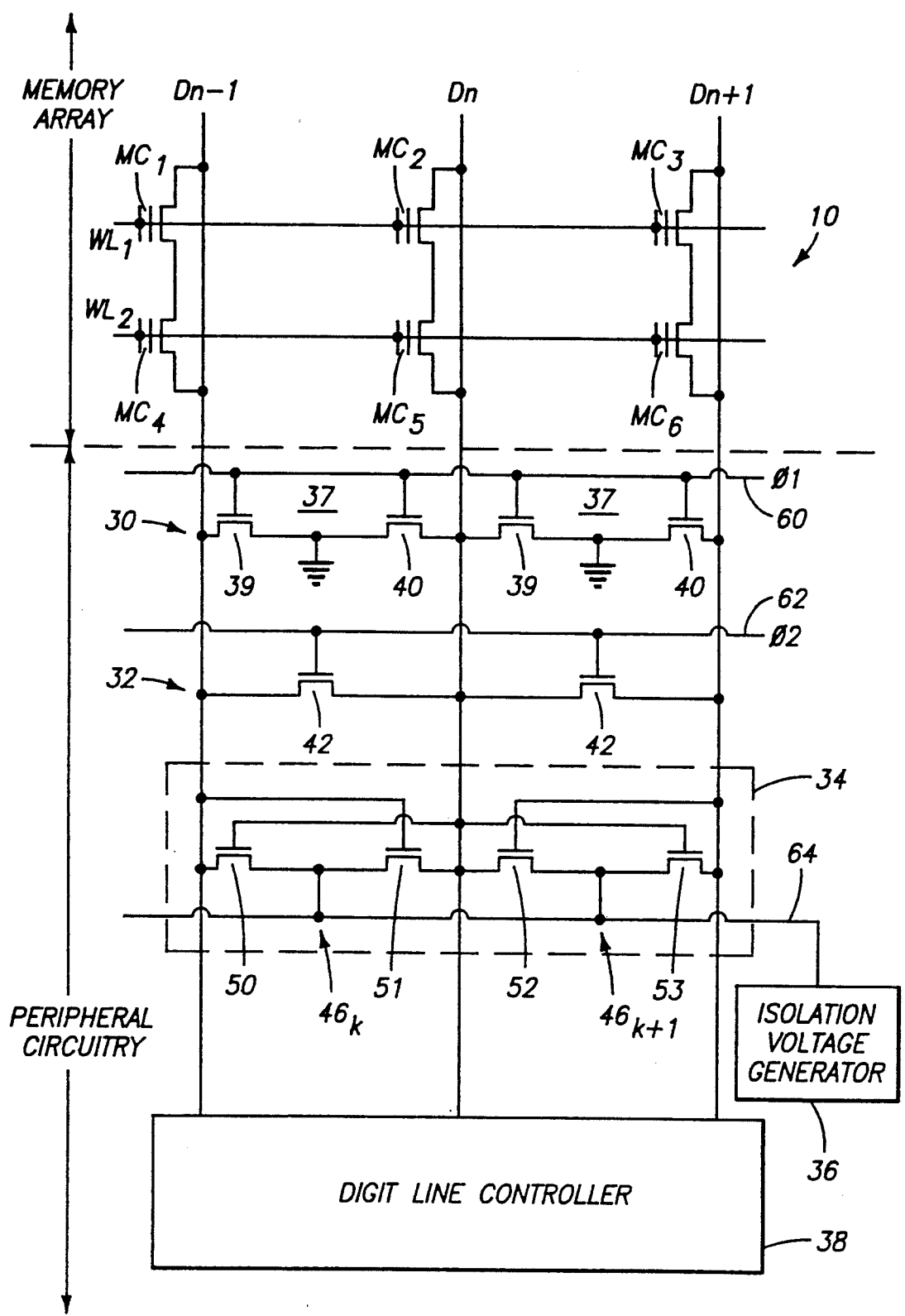
FIG. 5 is a schematic of peripheral circuitry for accessing memory cells of a semiconductor memory and isolation circuitry according to a preferred embodiment of the present invention.

FIG. 5 shows a schematic of EPROM 10 having an array of memory cells and peripheral control circuitry. The peripheral circuitry includes an isolation means according to the present invention which places an isolation voltage on adjacent digit lines in an effort to reduce or eliminate parasitic leakage. In EPROM 10, an array of memory cells $MC_1$-$MC_6$ are accessed by word lines $WL_1$, $WL_2$ and digit lines $D_{n-1}$, $D_n$, and $D_{n+1}$. Peripheral control circuits provided outside of the memory array include biasing circuitry 30, digit line potential equalizing circuitry 32, isolating circuitry 34, isolation voltage generator 36, and digit line controller 38. A word line controller is also typically included in the peripheral control circuits to control the operation of the word lines, but is not shown for clarity of description.

Biasing circuitry 30 is provided to initially ground all digit lines prior to any operation on the memory cells. Biasing circuitry 30 includes cells 37, each having two transistors 39, 40 with source-to-drain paths coupled between adjacent digit lines and a gate coupled to a control line 60. Upon receipt of a control signal $\phi_1$ over control line 60, both transistors 39, 40 are rendered conductive to ground all of the digit lines going to the memory array.

Digit line potential equalizing circuitry 32 is provided to ensure that the potential is equal on all digit lines going to the memory array. The step of equalizing digit line potential is also performed prior to accessing the memory devices and preferably is performed simultaneously with the step of grounding the digit line. Digit line equalizing circuitry 32 includes individual transistors 42 having a source-to-drain path coupled between adjacent digit lines. Transistors 42 have a gate connected to a control line 62. Upon receipt of a control signal $\phi_2$ over line 62, transistors 42 become conductive to short all digit lines together.

Digit line controller 38 selects an appropriate digit line for accessing a selected memory cell. Digit line controller 38 also applies the appropriate voltages for programming and reading from a selected memory cell.

Isolating circuitry 34 and isolation voltage generator 36 together form an isolating means for supplying an isolation voltage $V_i$ to digit lines immediately adjacent to the digit line selected to access a memory cell. Isolation voltage generator 36 generates isolation voltage $V_i$ and outputs this voltage over line 64. In the preferred embodiment, the isolation voltage is approximately one volt, although other voltages are possible as will be discussed below in more detail.

Figure 6:
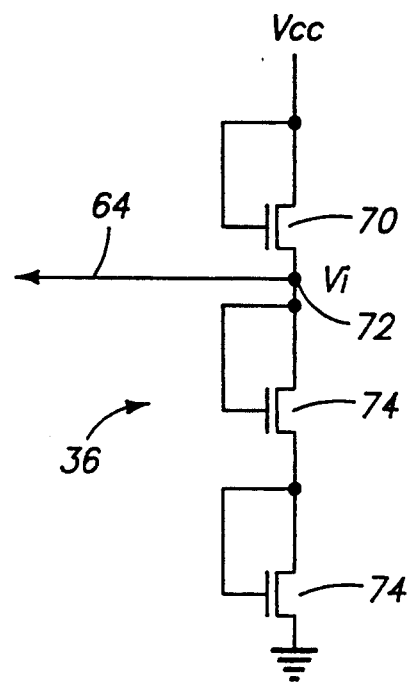
FIG. 6 is a schematic of an isolation voltage generator used in the isolation circuitry of FIG. 5.

According to an aspect of the invention, isolation voltage generator 36 may be a voltage divider as shown in FIG. 6. Isolation voltage generator 36 in its preferred form includes one or more transistors 70 between a power supply voltage $V_{cc}$ (such as five volts) and node 72. Isolation voltage generator 36 further includes one or more transistors 74 serially connected between node 72 and ground. The gates and drains of transistors 70 and 74 are tied together so that these transistors effectively operate as resistors. In this manner, an isolation voltage $V_i$ between power supply voltage $V_{cc}$ and ground is provided at node 72.

Isolating circuitry 34 provides an effective transfer means for identifying adjacent digit lines to receive isolation voltage $V_i$ and for passing isolation voltage $V_i$ to these adjacent digit lines. Isolating circuitry 34 includes multiple cells $46_k$, $46_{k+1}$, each of which is coupled between adjacent digit lines. Cell $46_k$ contains transistors 50 and 51 and is positioned between adjacent digit lines $D_{n-1}$ and $D_n$. Cell $46_{k+1}$ contains transistors 52 and 53 and is positioned between adjacent digit lines $D_n$ and $D_{n+1}$. Each cell in isolating circuitry 34 is preferably identical, and therefore only cell $46_k$ will be explained in detail. Transistor 50 of cell $46_k$ has a drain coupled to digit line $D_{n-1}$ and a gate coupled to digit line $D_n$. Transistor 51 has a drain coupled to digit line $D_n$ and a gate coupled to digit line $D_{n-1}$. The sources of transistors 50 and 51 are coupled together and to isolation voltage generator 36 via line 64.

The threshold voltages for transistors 50-53 are commensurate with the isolation voltage. Preferably, threshold voltage $V_t$ is approximately one volt since the isolation voltage $V_i$ is one volt.

The operation of the present invention during a programming step will now be described with reference primarily to FIG. 5. Prior to programming a selected memory cell, biasing circuitry 30 and digit line potential equalizing circuitry 32 ground and equalize potential on all digit lines. Transistors 50-53 of isolating circuitry 34 are not conductive at this time.

Digit line controller 38 then selects the digit line necessary to access a desired memory cell to be programmed. Digit line controller 38 also applies a program voltage sufficient to program the memory cell to the selected digit line. Likewise, a word line controller (not shown) selects and applies a voltage to an appropriate word line to program the desired memory cell. For discussion purposes, assume that digit line controller 38 selects digit line $D_n$ and applies a program voltage of approximately 10 volts to that digit line. As soon as the program voltage is applied to digit line $D_n$, transistor 50 of cell $46_k$ becomes conductive and passes the isolation voltage $V_i$ from line 64 to digit line $D_{n-1}$. As a result, digit line $D_{n-1}$ is raised to the isolation voltage $V_i$. Transistor 51 remains non-conductive since the voltages on the gate and source are both approximately equal to the isolation voltage $V_i$. In a similar manner, cell $46_{k+1}$ of isolating circuitry 34 applies the isolation voltage $V_i$ to digit line $D_{n+1}$ through transistor 53 (transistor 52 remains non-conductive). The remaining digit lines (..., $D_{n-3}$, $D_{n-2}$, and $D_{n+2}$, $D_{n+3}$, ..., which are not shown for purposes of clarity) are preferably at a potential of zero volts.

Therefore, as soon as a program voltage is placed on one of the digit lines (i.e., $D_n$), an isolation voltage $V_i$ is instantaneously and simultaneously placed on the immediately adjacent digit lines (i.e., $D_{n-1}$ and $D_{n+1}$). An advantage to isolating circuitry 34 is that it effectively "identifies" the immediately adjacent digit lines in response to the voltage being applied by the digit line controller to the selected digit line. That is, as soon as the voltage is applied to selected digit line $D_n$, isolating circuitry 34 "identifies" adjacent digit lines $D_{n-1}$ and $D_{n+1}$ in response to this voltage. Isolation voltage $V_i$ is less than the program voltage, but is sufficient to substantially reduce or eliminate parasitic leakage between neighboring memory cells.

In some circumstances, it may be desired to use isolation voltages greater than one volt. To accommodate for these higher isolation voltages, the manufacturer can design transistors 50-53 of isolation circuit 34 to have a threshold voltage $V_t$ consistent with these higher voltages. For example, if an isolation voltage of 3.5 volts was desired, an appropriate threshold voltage $V_t$ for the isolating cell transistors 50-53 would be approximately four volts. In this manner, when a high voltage is applied to digit line $D_n$, the transistors 50 and 53 are rendered conductive to place the isolation voltage of 3.5 volts onto the adjacent digit lines, but transistors 51 and 52 are not rendered conductive.

In compliance with the statute, the invention has been described in language more or less specific as to structural or methodical features. The invention is not, however, limited to the specific features described or shown, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor memory device comprising:
    an array of memory cells, individual memory cells having an active area;
    a plurality of conductive digit lines for accessing the memory cells, the digit lines electrically engaging the active areas of the memory cells;
    control means for selecting a digit line to access a memory cell and for applying an activation voltage to the selected digit line; and
    isolating means for supplying an isolation voltage to digit lines immediately adjacent to the selected digit line for isolating neighboring memory cells from parasitic leakage from the memory cell being accessed, the isolation voltage being less than the activation voltage.

2. A semiconductor memory device according to claim 1 wherein the isolating means identifies the immediately adjacent digit lines in response to the activation voltage applied to the selected digit line.

3. A semiconductor memory device according to claim 1 wherein the isolating means comprises:
    voltage generating means for providing the isolation voltage; and
    transfer means, coupled between the voltage generating means and the digit lines, for passing the isolation voltage to the digit lines immediately adjacent to the selected digit line.

4. A semiconductor memory device according to claim 3 wherein the transfer means comprises a plurality of cells, individual cells comprising:
    a first transistor having a source coupled to the voltage generating means, a drain coupled to one of the adjacent digit lines, and a gate coupled to the selected digit line; and
    a second transistor having a source coupled to the voltage generating means, a drain coupled to the selected digit line, and a gate coupled to the one adjacent digit line.

5. An electrically programmable read only memory comprising:
    an array of programmable memory cells, individual memory cells having an active area and a gate;
    a plurality of conductive word lines for accessing the memory cells, the word lines electrically engaging the gates of the memory cells;
    a plurality of conductive digit lines for accessing the memory cells, the digit lines electrically engaging the active areas of the memory cells;
    control means for selecting a memory cell to be programmed and for applying a program voltage sufficient to program the memory cell to a digit line that accesses the selected memory cell; and
    isolating means for supplying an isolation voltage to digit lines immediately adjacent to the digit line that accesses the selected memory cell to isolate neighboring memory cells from parasitic leakage from the selected memory cell, the isolation voltage being less than the program voltage.

6. An electrically programmable read only memory according to claim 5 wherein the isolating means comprises:
    voltage generating means for providing the isolation voltage; and
    transfer means, coupled between the voltage generating means and the digit lines, for passing the isolation voltage to the digit lines immediately adjacent to the digit line that accesses the selected memory cell.

7. An electrically programmable read only memory according to claim 6 wherein the transfer means comprises a plurality of cells, individual cells comprising:
    a first transistor having a source coupled to the voltage generating means, a drain coupled to one of the adjacent digit lines, and a gate coupled to the selected digit line; and
    a second transistor having a source coupled to the voltage generating means, a drain coupled to the selected digit line, and a gate coupled to the one adjacent digit line.

8. A semiconductor memory device comprising:
    an array of memory cells, individual memory cells having an active area;
    a plurality of conductive digit lines arranged to access the memory cells, the digit lines electrically engaging the active areas of the memory cells;
    control means for selecting a digit line to access a selected memory cell and for applying an activation voltage to the selected digit line;
    voltage generating means for providing an isolation voltage; and
    transfer means, coupled between the voltage generating means and the digit lines, for identifying digit lines immediately adjacent to the selected digit line in response to the activation voltage applied to the selected digit lines and for passing the isolation voltage to the digit lines immediately adjacent to the selected digit line to isolate neighboring memory cells from parasitic leakage from the selected memory cell.

9. A semiconductor memory device according to claim 8 wherein the transfer means comprises a plurality of cells, individual cells comprising:
    a first transistor having a source coupled to the voltage generating means, a drain coupled to one of the adjacent digit lines, and a gate coupled to the selected digit line; and
    a second transistor having a source coupled to the voltage generating means, a drain coupled to the selected digit line, and a gate coupled to the one adjacent digit line.

10. A semiconductor memory device comprising:
    an array of memory cells, individual memory cells having an active area;
    first and second conductive digit lines adjacently arranged to access memory cells in the array, the digit lines electrically engaging the active areas of the memory cells;
    voltage generating means for providing an isolation voltage sufficient to isolate memory cells from parasitic leakage therebetween;
    a first transistor having a source coupled to the voltage generating means, a drain coupled to the first digit line, and a gate coupled to the second digit line adjacent the first digit line; and
    a second transistor having a source coupled to the voltage generating means, a drain coupled to the second digit line, and a gate coupled to the first digit line.

11. In a semiconductor memory device, a method for isolating a selected memory cell from neighboring memory cells, the semiconductor memory device having a plurality of memory cells and a plurality of conductive digit lines for accessing the memory cells, individual memory cells having an active area, the digit lines electrically engaging the active areas of the memory cells, the method comprising the steps of:

applying an activation voltage to a selected digit line to access a selected memory cell;

generating an isolation voltage which is less than the activation voltage; and applying the isolation voltage to digit lines immediately adjacent to the digit line that accesses the selected memory cell for isolating neighboring memory cells from parasitic leakage from the selected memory cell, the isolation voltage being applied simultaneously with the application of the activation voltage.

* * * * *